INVENTORS
ICHIRO MIWA
YOSHITO OHMURA
BY:

INVENTORS
ICHIRO MIWA
BY: YOSHITO OHMURA

United States Patent Office 3,449,682
Patented June 10, 1969

3,449,682

INTEGRATED-CASCODE AMPLIFIER WITH IMPROVED FREQUENCY CHARACTERISTIC

Ichiro Miwa and Yoshito Ohmura, Tokyo-to, Japan, assignors to Kabushiki Kaisha Hitachi Seisakusho, Chiyoda-ku, Tokyo-to, Japan, a joint-stock company of Japan Filed Jan. 17, 1968, Ser. No. 698,587
Claims priority, application Japan, Jan. 20, 1967, 42/4,774
Int. Cl. H03f 3/68
U.S. Cl. 330—20 1 Claim

ABSTRACT OF THE DISCLOSURE

In a semiconductor integrated-circuit device comprising first and second transistors of n-p-n type formed as a cascode circuit in a single p-type semiconductor substrate, the base region of the first transistor in common-emitter configuration is made larger in size than the base region of the second transistor in common-base configuration so that a large base contact can be attained, and the base-spreading resistance of the first transistor will be small, whereby the frequency characteristic of the device as an amplifier is substantially improved.

*Background of the invention*

The invention relates to the field of semiconductor integrated circuit devices including transistor cascode amplifiers.

In general, a transistor cascode amplifier has an organization wherein a first transistor in common-emitter configuration and a second transistor in common-base configuration are connected in series, and when an input signal is impressed on the base terminal of the first transistor, an output signal in an amplified form is obtained from the collector of the second transistor.

In the circuit of such an amplifier, the negative feedback admittance Y12 is extremely low in spite of the fact that the mutual conductance gm. is substantially equal to that in the case of the first-stage transistor of common-emitter configuration. For this reason, neutralization is not necessary even in the case of amplification in a high-frequency region. Furthermore, since the output side of the circuit is of a common-base configuration of high output impedance, the circuit has advantages such as very high power gain.

In a cascode amplifier of heretofore known type, in general, transistors of the same characteristics are used for the two transistors thereof. For example, when a cascode amplifier of excellent high-frequency characteristic is desired, it has been the practice in the prior art to use transistors each of excellent high-frequency characteristic for both of the above mentioned two transistors.

As is known, the high-frequency characteristic is governed by three parameters, namely, the base-spreading resistance $r_{bb}$, collector capacitance $C_c$, and $\alpha$ cutoff frequency $f\alpha$. While low values of both the base-spreading resistance $r_{bb}$ and the collector capacitance $C_c$ of these three parameters produce an excellent high-frequency characteristic, these two parameters in an actual transistor element have a mutually conflicting relationship whereby it is not possible to reduce both parameters to an amply low value.

More specifically, the base-spreading resistance $r_{bb}$ is determined by the area and dispositional state of the base electrode formed in contact with the base region surface. In order to reduce the value of this resistance $r_{bb}$, a large base region must be used. On the other hand, however, the collector capacitance $C_c$ is determined by the area of the p-n junction formed between the base region and the collector region. In order to obtain a low value of this capacitance $C_c$, it is necessary to make the area of the p-n junction small. In practical terms, this means the use of a small base region, which results in a high value of the base-spreading resistance $r_{bb}$.

Thus, in an ordinary high-frequency transistor, the base-spreading resistance $r_{bb}$ and the collector capacitance $C_c$ can be reduced to only values within a range wherein their mutual compromise can be attained. For this reason, efforts have been directed toward increasing the $\alpha$ cutoff frequency $f\alpha$, which is the one remaining parameter of the above mentioned three parameters, for improvement of the high-frequency characteristics of transistors. One example of such efforts has been a transistor construction in which the width of the base region is made as small as possible.

Accordingly, in a transistor cascode amplifier of known organization, there is inevitably a limit to improvement in the expected high-frequency characteristic even when transistors of the highest level of high-frequency characteristics which are available at present are used for the first and second transistors. Therefore, there has not been much hope for further and substantial improvement in the high-frequency characteristics of known transistor cascode amplifiers.

*Summary of the invention*

It is an object of the present invention to provide further and substantial improvement in the frequency characteristics of transistor cascode amplifiers.

The foregoing object has been achieved in accordance with the invention by the organization, as an integrated circuit on a single semiconductor substrate, of a circuit comprising, in cascode configuration, a first transistor in common-emitter configuration designed with a large base region principally for the purpose of decreasing the base-spreading resistance thereof and a second transistor in common-base configuration designed to have a base region of smaller size than that of the first transistor principally for the purpose of decreasing the collector capacitance of the second transistor.

*Brief description of the drawings*

The nature, principle, details, and utility of the invention will be more clearly apparent from the following detailed description, beginning with a consideration of the principle of the invention followed by a description of preferred embodiments of the invention, when read in conjunction with the accompanying drawings, in which like parts are designated by like reference numerals and characters.

In the drawings.

Figure 1:
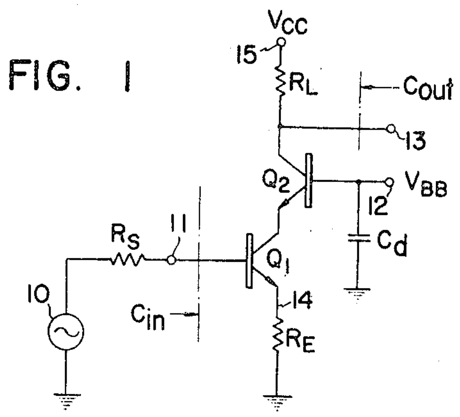
FIG. 1 is a circuit diagram of a transistor amplifier circuit of cascode connection type for an explanation of the principle of the invention.

As mentioned briefly hereinbefore and as indicated in FIG. 1, in a cascode amplifier, a transistor Q1 of common-emitter configuration and a transistor Q2 of common-base configuration are connected in series. In the circuit shown in FIG. 1, the collector of the transistor Q2 is connected to a load resistance $R_L$, and the base 12 of the transistor Q2 is grounded (earthed) with respect to alternating current by a bypass capacitor *Cd*. A resistance $R_E$ is inserted in the emitter circuit 14 of the transistor Q1 to improve the linearity of the amplification characteristic thereof, but this resistance is not an indispensable component in a cascode connection type circuit.

When, with a D-C voltage $V_{cc}$ applied to one terminal 15 of the collector circuit of the transistor Q2 and a D-C bias voltage $V_{BB}$ applied to the base terminal 12 of the transistor Q2, an input signal is introduced through the base input terminal 11 of the transistor Q1, this input signal is amplified and led out as output from the collector output terminal 13 of the transistor Q2.

With the assumption that the input terminal 11 of this circuit is connected to a signal source 10 having an effective source impedance R*s* of the power supply, the frequency characteristic of this circuit will now be analytically considered.

The frequency characteristic may be considered by a division thereof into that of the cutoff in the input side and that of the cutoff in the output side of the circuit, the overall frequency characteristic being governed by the poorer characteristic of the two.

Figures 2, 3, 4:
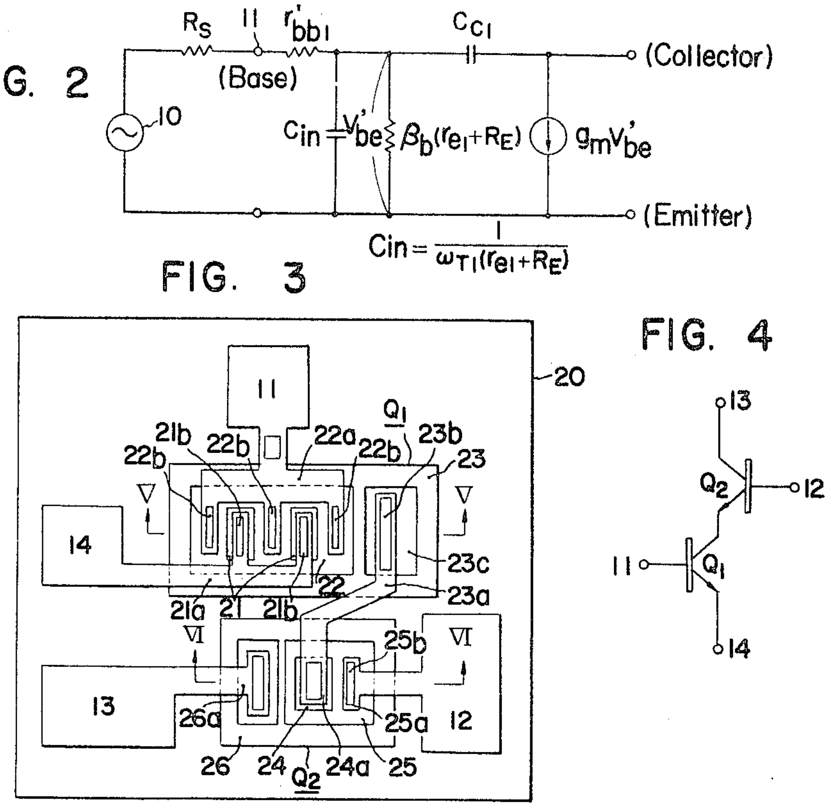
FIG. 2 is an equivalent circuit diagram of the input side of the circuit shown in FIG. 1.
FIG. 3 is an enlarged plan view showing a semiconductor pellet formed in a manner to integrate a circuit according to the invention.
FIG. 4 is a schematic diagram showing an example of connection of a transistor circuit included in the integrated circuit illustrated in FIG. 3.

The cutoff of the input side in influenced by the signal source impedance *Rs*, the base-spreading resistance $r'_{bb1}$ of the transistor Q1, and the input capacitance $C_{in}$ of the transistor Q1 corresponding to the equivalent capacitance as viewed toward the right-hand side from the base of the transistor Q1. For example, when the transistor Q1 of common-emitter configuration is represented by a hybrid $\pi$-type equivalent circuit as shown in FIG. 2, the input cutoff frequency may be expressed by the following equation:

$$f_{cin}=\frac{R_E+r_{e1}}{R_s+r'_{bb1}}\cdot\frac{\omega_{T1}}{2\pi} \quad (1)$$

where: input cutoff frequency $f_{cin}$ is defined by the frequency at which the terminal voltage $V'_{be}$ of input capacitance $C_{in}$ decrease by 3 db; and $\omega_{T1}$ is the angular cutoff frequency of the transistor Q1. This angular cutoff frequency has a value defined by the following equation in terms of the emitter diffusion capacitance *Ce* and emitter diffusion resistance $r_{e1}$ of the transistor Q1.

$$\omega_{T1}=1/Cer_{e1} \quad (2)$$

From the above Equation 1, it is apparent that one of the conditions (hereinafter referred to as the first condition) for elevating the input cutoff frequency is the decreasing of the base-spreading resistance of the transistor Q1 of common-emitter configuration.

On the other hand, the cutoff in the output side is influenced by the load resistance $R_L$ and the output capacitance $C_{out}$ defined by the equivalent capacitance as viewed toward the left from the output terminal 12, and the output cutoff frequency $f_{c.\,out}$ is representable by the following equation:

$$f_{c.\,out}=1/2\pi R_L C_{out} \quad (3)$$

The output capacitance $C_{out}$ comprises, principally, a capacitance $C_{o2}$ as defined below and a capacitance component $C_L$ contained in the load. Capacitance $C_{o2}$ is given by the following equation in terms of the emitter resistance $r_{e2}$, base-spreading resistance $r'_{bb2}$, and collector capacitance $C_{c2}$ of the transistor Q2 and the signal source impedance as viewed from the emitter of the transistor Q1, that is, the output resistance R*g* of the transistor Q2 in this instance:

$$C_{o2}=C_{c2}\left(1+\frac{r'_{bb2}}{r_{e2}+R_g}\right) \quad (4)$$

However, the value of the capacitance component $C_L$, in general, is small. Moreover, in the above Equation 4, the quantity $r'_{bb2}/r_{e2}+R_g$ is negligible in almost all cases since the value of R*g* is much greater than that of $r'_{bb2}$. That is, for example, with respect to a value of $r'_{bb2}$ of the order of hundreds of ohms, the value of R*g* is of the order of from a number of kilo-ohms to tens of kilo-ohms. Therefore, the output capacitance $C_{out}$ may be considered to be equal to the collector capacitance $C_{c2}$ of the transistor Q2 in almost all cases.

From the above consideration, it may be concluded that one condition (hereinafter referred to as the second condition) for elevating the output cutoff frequency is the decreasing of the collector capacitance $C_{c2}$ of the transistor Q2 under the condition of $r'_{bb2} \ll Rg$.

The input impedance of the transistor Q2 of common-base configuration corresponds to the load of the transistor Q1 of common-emitter configuration and, in actuality, is of very small value. For this reason, the collector capacitance $C_{c1}$ of the transistor Q1 has very little effect on the frequency characteristics of the amplifier. This means that the first condition of decreasing the base-spreading resistance $r'_{bb1}$ of the transistor Q1 is conveniently realized in the cascode circuit.

The present invention is based on the above analytical consideration and provides an organization, in a cascode amplifier comprising a transistor Q1 of common-emitter configuration and a transistor Q2 of a common-base configuration both formed in an integrated state in a single semiconductor substrate, wherein the transistor Q2, while there is some increase in the base-spreading resistance $r'_{bb2}$, has, on the other hand, a small base region such as to produce a small value of the collector capacitance $C_{c2}$ in order to satisfy the aforementioned second condition, and the transistor Q1, on one hand, has a base region which is formed to be larger that the base region of the transistor Q2 thereby to cause the base-spreading resistence $r'_{bb1}$ to be small in order to satisfy the aforementioned first condition, whereby the overall frequency characteristic is substantially improved.

An example of practical embodiment of the invention is illustrated in FIG. 3. In this cascode amplifier, transistors Q1 and Q2 are formed in a mutually isolated arrangement in a single semiconductor substrate 20 having a p-type conductivity and are coupled by conductors formed by metal, such as aluminum, deposited by evaporation thereby to form an integrated circuit device.

This integrated circuit organization contains a circuit part as shown by an equivalent circuit in FIG. 4 and has outer terminals designated by corresponding reference numerals 11, 12, 13, and 14.

The transistor Q1 is of n-p-n type and has emitter regions 21, a base region 22, and a collector region 23 provided respectively with electrodes **21*a*, 22*a*, and 23*a*, the contact parts of the emitter, base, and the collector regions and their respective electrodes being designated respectively by reference numerals 21*b*, 22*b*, and 23*b***.

Figure 5:
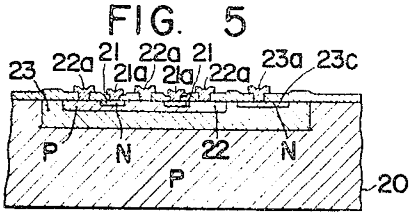
FIG. 5 is an elevational view in vertical section taken along the plane indicated by line V—V in FIG. 3 and showing one of the transistors contained in the circuit shown in FIG. 3.

As shown in FIG. 5, which is a sectional view of the transistor Q1 taken along the plane indicated by line V—V in FIG. 3 and viewed in the arrow direction, an n-type region 23 formed on the outer surface of the single semiconductor substrate 20 having a p-type conductivity constitutes the collector, and as p-type region 22 formed by diffusing an acceptor (p-type impurity) into the above mentioned n-type region from the surface thereof constitutes the base. Furthermore, two n-type regions 21 formed by diffusing a donor (n-type impurity) into the surface part of this base region constitute the emitters. An n-type highly-concentrated region 23c is formed on the surface of the collector region 23 for the purpose of reducing the contact resistance between the collector and the collector electrode 23a.

In this transistor Q1, the contact area of the base electrode 22a with respect to the base region 22 is made large with the aim of decreasing the base-spreading resistance $r'_{bb1}$, and for this purpose, stripe-shaped base contacts 22b are formed at three places.

Figure 6:
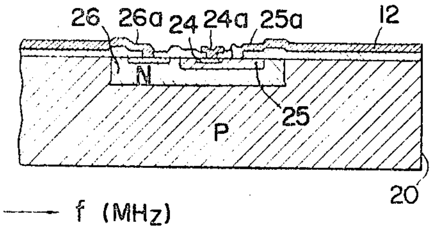
FIG. 6 is an elevational view in vertical section taken along the plane indicated by line VI—VI in FIG. 3 and showing the other transistor contained in the circuit shown in FIG. 3.

The transistor Q2 is of n-p-n type and has an emitter region 24, a base region 25, and a collector region 26 respectively in contact with electrodes 24a, 25a, and 26a. The emitter electrode 24a is connected to the collector electrode 23a of the transistor Q1 to form a cascode circuit. The transistor Q2 is so designed that the base region 25 is made as small as possible so as to reduce particularly the collector capacitance $C_{c2}$. For example, as shown in FIGS. 3 and 6, a single emitter region 24 and a single base contact 25b of stripe shape are provided, whereby this transistor Q2 has a configuration differing from that of the transistor Q1.

It has been found that when, in the organization indicated in FIG. 3, the transistor Q1 is formed with a base region 22 measuring 40 x 82.5 microns, emitter regions 21 each measuring 30 x 15 microns, and base contacts each measuring 30 x 7.5 microns, a transistor having a base-spreading resistance $r'_{bb1}$ of approximately 50 ohms and a collector capacitance $C_{c1}$ of the order of 1.7 picofarads is obtained.

Furthermore, when the transistor Q2 is formed with a base region 25 measuring 40 x 37.5 microns, an emitter region 24 measuring 20 x 5 microns, and a base contact 25b measuring 30 x 7.5 microns, a transistor having a base-spreading resistance $r'_{bb2}$ of 400 ohms and a collector capacitance $C_{c2}$ of the order of 0.7 picofarad is obtained.

Figures 7, 8:
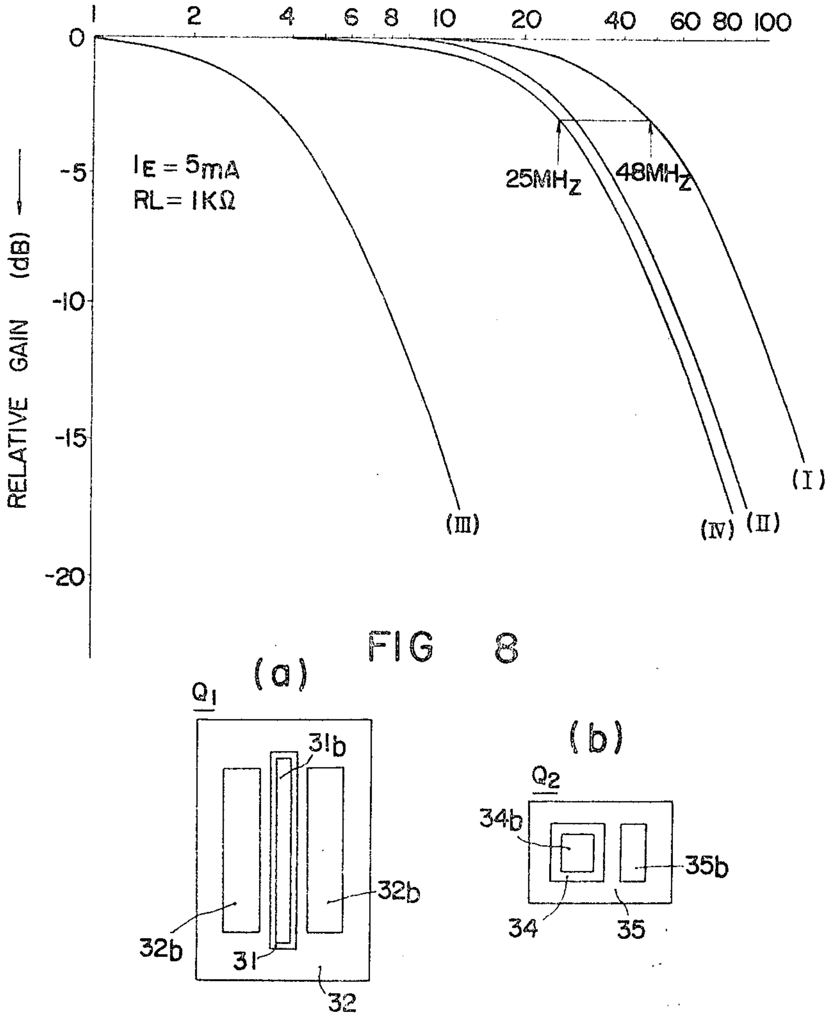
FIG. 7 is a graphical representation indicating the relative gain-frequency characteristics of one example of a circuit of the invention and of circuits of known organization.
FIGS. 8(*a*) and 8(*b*) are planar views showing one example of the various possible patterns which can be used for the transistors employed in the circuit of the invention.

The frequency characteristic, as expressed in terms of the relationship between relative gain and frequency, obtained when a load resistance $R_L$ of 1 kilo-ohm is connected to the terminal 13 of the above described device of the invention is indicated by characteristic curve I in FIG. 7, in which the abscissa represents frequency (mHz.) and the ordinate represents relative gain (db).

For comparison with this curve I, characteristic curves II, III, and IV are also shown in FIG. 7. Curve II indicates the frequency characteristic of a cascode amplifier organized with the use of two transistors each corresponding to the above described transistor Q1. Curve III indicates that of a cascode amplifier in which two transistors each corresponding to the above described transistor Q2 are used. Curve IV indicates the frequency characteristic of a cascode amplifier organized with the use of two transistors each having a base-spreading resistance $r'_{bb}$ of 100 ohms and a collector capacitance of 1 picofarad.

From a comparative examination of these characteristic curves in FIG. 7, it is apparent that the characteristic as represented by curve I of the circuit of the invention is greater superior to the characteristic as represented by curve IV of a circuit of general, known type comprising two transistors each designed to have small values of both base-spreading resistance $r'_{bb}$ and collector capacitance $C_c$ and, furthermore, is superior to the characteristic of curve II of the circuit comprising two transistors each designed to have, particularly, a small value of base-spreading resistance $r'_{bb}$. Thus, the effectiveness and utility of the present invention is amply indicated.

In a semiconductor integrated circuit, transistors of different planar configurations can be very readily obtained. Accordingly, great convenience is afforded when a circuit of the invention organized with the use of transistors Q1 and Q2 having mutually different configurations is constructed as a semiconductor integrated circuit.

Furthermore, in a cascode amplifier in the form of a semiconductor integrated circuit, there is included, in addition to capacitance component $C_L$ and capacitance $C_{o2}$ constituting the output capacitance $C_{out}$ as expressed in Equation 3 set forth hereinbefore, an isolation capacitance $Cs$ existing in the p-n junction formed between the substrate structure and the collector region as a result of forming the transistor Q2 in an isolated state on the semiconductor substrate structure. In the device of the invention, however, the base region of the transistor Q2 is made small particularly for decreasing the base-spreading resistance thereof, and, as a natural consequence, the above mentioned isolation capacitance $Cs$ also becomes small, the deterioration of the cutoff frequency characteristic on the output side thereby becoming small.

It should be understood that, in the device according to the invention, the configuration of the transistor Q1 of common-emitter type adapted to cause the base-spreading resistance $r_{bb'1}$ to be as small as possible and the configuration of the transistor Q2 of common-base type adapted to cause the collector capacitance $C_{c2}$ to be as small as possible may take various forms other than those illustrated in the above described example of practice.

For example, it is also possible to use a configuration of the transistor Q1, as illustrated in FIG. 8(*a*), wherein an emitter region 31 is formed with a long and narrow shape in a base region 32, and large base contacts 32b are formed parallelly on respectively opposite sides of the emitter region 31 and a configuration of the transistor Q2, as illustrated in FIG. 8(*b*), wherein a small base contact 35b is formed on only one side of an emitter region 34 so as to decrease the size of the base region 35 as much as possible. The parts designated by reference numerals 31b and 34b in FIG. 8 are respectively emitter contacts.

Accordingly, it should be understood that the foregoing disclosure relates to only preferred embodiments of the invention and that it is intended to cover all changes and modifications of the examples of the invention herein chosen for the purposes of the disclosure.

What we claim is:

1. In an integrated circuit having:

(a) a semiconductor substrate (20);

(b) first and second transistors (Q1), (Q2) of the same conductivity type formed in said substrate in mutually isolated state, the collector (23) of said first transistor being conected to the emitter (24) of said second transistor, and said first and second transistors being defined in common-emitter and common-base configurations, respectively, to form a cascode configuration;

(c) an input terminal (11) connected to the base (22) of the first transistor; and (d) an output terminal (13) connected to the collector (26) of the second transistor, the improvement wherein the base region of the first transistor is formed to be relatively larger in size than that of the second transistor thereby to cause the base resistivity of the first transistor to be less than that of the second transistor and the collector capacitance of the second transistor to be less than that of the first transistor and thereby to improve the cutoff frequency of the integrated circuit.

References Cited

UNITED STATES PATENTS 3,015,763 1/1962 Bailey ---------------- 317—235

ROY LAKE, *Primary Examiner.*

J. B. MULLINS, *Assistant Examiner.*

U.S. Cl. X.R.

330—38; 317—235; 307—303